United States Patent
Pedretti (10) Patent No.: US 6,709,769 B1
(45) Date of Patent: Mar. 23, 2004

(54) COMPONENT FOR MULTILAYER PRINTED CIRCUIT BOARD, METHOD OF PRODUCTION THEREOF AND ASSOCIATED MULTILAYER PRINTED CIRCUIT BOARD

(75) Inventor: Giuseppe Pedretti, Cremona (IT)

(73) Assignee: Zincocelere S.p.A. (IT)

( * ) Notice: Subject to any disclaimer, the term of this patent is extended or adjusted under 35 U.S.C. 154(b) by 0 days.

(21) Appl. No.: 09/787,122

(22) PCT Filed: Sep. 6, 1999

(86) PCT No.: PCT/IT99/00283

§ 371 (c)(1),
(2), (4) Date: Mar. 14, 2001

(87) PCT Pub. No.: WO00/16596

PCT Pub. Date: Mar. 23, 2000

(30) Foreign Application Priority Data

Sep. 14, 1998 (IT) .......................................... TO98A0779

(51) Int. Cl.⁷ .......................... B32B 15/04; B32B 15/08; B32B 15/20; B23K 1/06; B23K 31/02
(52) U.S. Cl. .......................... 428/626; 428/652; 428/457; 428/336; 428/304.4; 428/192; 228/110.1; 228/111; 228/178
(58) Field of Search ................................ 428/548, 577, 428/583, 594, 615, 621, 624, 626, 607, 650, 652, 674, 675, 687, 45, 53, 58, 166, 213, 215, 304.4, 344, 336, 457, 901, 192; 29/17.1, 17.2, 17.3, 17.5; 228/110.1, 111, 178; 361/751, 762; 439/55

(56) References Cited

U.S. PATENT DOCUMENTS

| | | | |
|---|---|---|---|
| 4,499,152 A | 2/1985 | Green et al. .................. 428/448 |
| 5,082,160 A | 1/1992 | Leigh ........................... 228/110 |
| 5,153,050 A | 10/1992 | Johnston ...................... 428/209 |
| 5,160,567 A * | 11/1992 | Konicek et al. .............. 156/288 |
| 5,942,314 A * | 8/1999 | Fisher et al. ................. 428/198 |
| 6,127,051 A * | 10/2000 | Frater ........................... 428/677 |
| 6,129,990 A * | 10/2000 | Frater ........................... 428/607 |
| 6,129,998 A * | 10/2000 | Frater ........................... 428/677 |
| 6,132,851 A * | 10/2000 | Poutasse ...................... 428/209 |
| 6,376,008 B1 * | 4/2002 | Steiner et al. ................. 427/96 |
| 2002/0061415 A1 * | 5/2002 | Steiner et al. ............... 428/626 |

FOREIGN PATENT DOCUMENTS

| EP | 872301 | 10/1998 |
|---|---|---|
| GB | 1217104 | 3/1969 |
| JP | 10-291080 | * 11/1998 |

* cited by examiner

Primary Examiner—Michael LaVilla
(74) Attorney, Agent, or Firm—Banner & Witcoff, Ltd.

(57) ABSTRACT

A method is described for the manufacture of a Copper-Aluminium-Copper component (C-A-C "sandwich") which can be used in the production of multilayer printed circuit boards, obtained by means of joining two external sheets of copper to one internal sheet of aluminium by means of a process of electro-mechanical joining, which does not require the use of additional material (such as, for example, an adhesive) and guarantees a consistently high level of quality. The joining process, normally continuous, is based on the use of a sonotrode to effect ultrasonic welding, wherein a single ultrasonic weld provides two joining zones between the two external copper sheets and the one internal aluminium sheet. According to a further embodiment, the component is manufactured with at least one layer of resin deposited externally on one of the external faces of the two copper sheets, which are not into contact with the internal aluminium sheet.

17 Claims, 4 Drawing Sheets

COMPONENT FOR MULTILAYER PRINTED CIRCUIT BOARD, METHOD OF PRODUCTION THEREOF AND ASSOCIATED MULTILAYER PRINTED CIRCUIT BOARD

FIELD OF THE INVENTION

The present invention relates to multilayer printed circuit boards, and more specifically to a component suitable for use in manufacturing multilayer printed circuit boards, and to a method used for its manufacture.

BACKGROUND OF THE INVENTION

Multilayer printed circuit boards are widely used in modern electronic equipment, particularly that which is used professionally, since, amongst other things, they allow the assembly of electronic components with a greater density, thus reducing the bulk of the equipment itself. The conventional method for manufacturing multilayer printed circuit boards is well known to those acquainted with the sector art and for this reason a detailed description will not be given here, for a better understanding of the present invention, it may be useful to recall that in the step of preparing the so-called "stacks", a mirror-polished stainless steel plate is used in the hot pressing step, placed as a separator between two separate multilayer circuit boards to which it is fixed by means of a separation film. This is in order to protect the external surfaces of the circuit boards. It also minimises the surface irregularities and makes the temperature distribution uniform.

The separation film is used to prevent any infiltration of the adhesive used between the layers which make up the multilayer circuit boards, and has to be removed at the end of the process, while the mirror-polished stainless steel plate is polished thoroughly before being used again; this procedure is complex and costly, comprising the quality and the efficiency of the manufacturing process.

The U.S. Pat. No. 5,153,050 proposes and describes a variation of the conventional process referred to above, in which provision is made for the use of a specific component consisting of a laminate made typically from two external copper sheets and one internal aluminium sheet, sealed at the edges. At the end of the process, the two copper sheets will each become the outermost conductive layer of two distinct multilayer circuit boards, while the aluminium sheet is a disposable element, which is eliminated at the end of the process itself.

The faces of the two copper sheets and the face of the aluminium sheet placed in reciprocal contact must not be contaminated, i.e. they must be free from all particles (e.g., resin and glass fibre dusts) and adhesive. A light strip of temporary adhesive along the perimeter fixes the non-contaminated faces to each other, thus defining two non-contaminated central zones, protected during the subsequent steps of the work. The aluminium sheet also contributes by giving the whole rigidity, facilitating handling operations.

The process for manufacturing multilayer printed circuit boards using this component is generally designated with the initials C-A-C, meaning Copper-Aluminium-Copper, or with the initials R-A-R in Italian (Rame-Alluminio-Rame).

One inconvenient aspect of the C-A-C process is the high cost of the adhesive, since very specific properties are required, as it has to remain stable and effective during the various steps of the work and it must be easily removable, without leaving any residue at the end of the process. For this reason the manufacturers of multilayer printed circuit boards felt it was necessary to find a cheaper but highly reliable alternative.

Furthermore, in the manufacture of multilayer printed circuit boards, the technology of microdrilling using a "laser" light ray has recently been developed, also called laser microdrilling for brevity, where by this term is meant the non pass-through drilling of holes with a very small diameter, typically ranging between 0.05 mm and 0.25 mm. These non-through holes, as those acquainted with the sector art will know, are normally made on the outer surfaces of the multilayer printed circuits, and are intended to be suitably metalized in such a way as to electrically connect the circuits made on the outer conductive layer of copper to the circuits made on the inner conductive layers. As laser microdrilling is much more effective when the material to be drilled does not contain glass fiber, the solution most widely adopted recently is to use a component made from a copper sheet covered on one side by a layer of epoxy resin of variable thickness, where this component is known as RCC foil, the abbreviation RCC standing for "Resin Coated Copper". In fact, if this component is applied to the outer surfaces of the multilayer printed circuit board in place of the normal copper sheet, drilling with a laser ray is made possible with a much greater efficiency, since under the copper sheet the laser ray does not meet the glass fiber typically present in the insulating layers of the multilayer printed circuit board, but instead meets the resin.

On the other hand, the presence of the layer of resin makes this component particularly delicate to handle, to the extent that simply bending it may lead to microcracks in the layer of resin with resultant product defects.

Use of these RCC components is therefore considerably critical, as their fragility is their worst defect.

SUMMARY OF THE INVENTION

The object the present invention is to define a component for the C-A-C multilayer printed circuit board manufacturing process, which is economical, can be made using know, tried and tested systems, having a high level of productivity, and which make if possible to achieve excellent quality and reliability. The component of the invention is obtained by joining the two external copper sheets to the internal aluminium sheet by means of a continuous electro-mechanical or mechanical process, which does not require additional materials (such as adhesive) and guarantees a consistently high level of quality.

This process will preferably consist of ultrasonic welding, subject to appropriate regulation of the power and pressure, or of a knurling operation, subject to the definition of the properties of the imprint.

Another object of the invention is that of defining a method for manufacturing C-A-C type multilayer printed circuit boards based on the use of a component obtained by the joining of the two external copper sheets to the internal aluminium sheet by means of a continuous electro-mechanical or mechanical process, such as ultrasonic welding or knurling.

A further object of the invention is that of defining a multilayer printed circuit board, manufactured by means of a C-A-C type method based on the use of a component made by the joining of the two external copper sheets to the internal aluminium sheet by means of a continuous electro-mechanical or mechanical process, such as ultrasonic welding or knurling. Another object of this invention is to define a component suitable for being used in a process for manufacturing multilayer printed circuits, based on use of the laser microdrilling technology, wherein the said component is capable of overcoming the drawbacks, particularly the fragility, typical of the components used at the moment. The component of the invention is obtained by joining at last one copper sheet with an aluminium sheet by means of a continuous electromechanical or mechanical process, that does not need any additional materials (such as adhesive) and guarantees a consistently high level of quality, and further by depositing a layer of resin on the outer surface of the copper sheet not in contact with the aluminium sheet.

The above mentioned objects are obtained by means of a component, and a manufacturing method characterized as defined in the main claims.

These and other objects, characteristics and advantages of the invention will become evident on the basis of the following description of a preferred embodiment, provided purely by way of an illustrative, non-restrictive example, and with reference to the accompanying drawings.

DESCRIPTION OF A FIRST PREFERRED EMBODIMENT OF THE INVENTION

Figure 1:
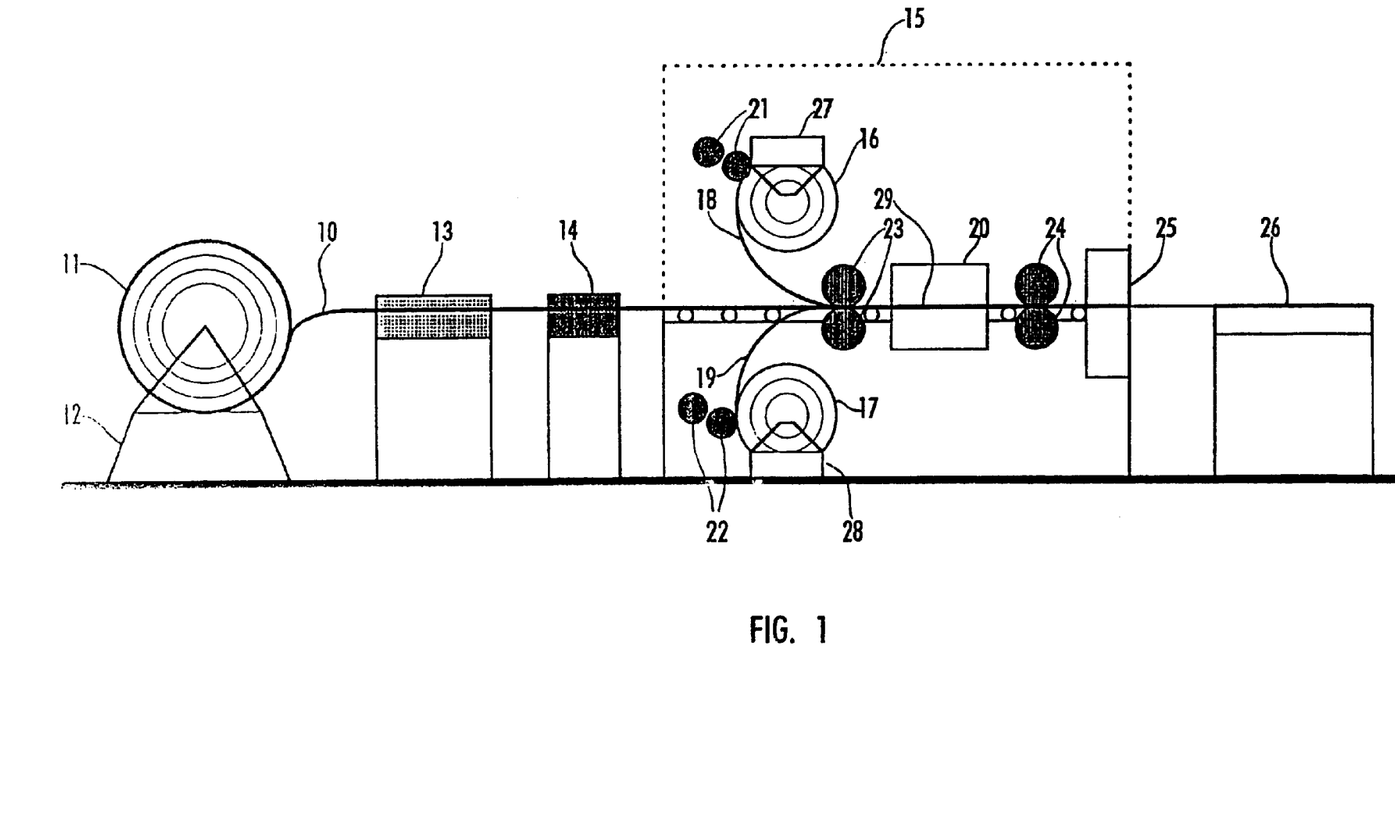
FIG. 1—Is a schematic view of the equipment used for the manufacture of the component for multilayer printed circuit boards in accordance with this invention, in a first embodiment thereof.

FIG. 1 represents a schematised lateral view of the equipment used for the manufacture of the component for multilayer printed circuit boards in accordance with this invention, in a first embodiment thereof.

The equipment includes a known type unwinder 12, on which is mounted a reel 11 of an aluminium ribbon 10; a straightening device 13 and a dust remover 14, both of which known type, which act on the aluminium ribbon 10; a first joining station 15 consisting of a first pair of rectified, rubber-coated rollers 23 for feeding and a second pair of rectified, rubber-coated rollers 24 for traction, a higher unwinder 27, of known type, on which is mounted an upper reel 16 of an upper cooper ribbon 18, a lower unwinder 28, of known type, upon which is mounted a lower reel 17 of a lower copper ribbon 19, a first pair 21 of dust-removing rollers acting on the upper copper ribbon 18 and a second pair 22 of dust-removing rollers acting on the lower copper ribbon 19, a sonotrode 20 for the ultrasonic welding of a "sandwich" 29 consisting of an aluminium ribbon 10 and the upper 18 and lower 19 copper ribbons, and finally of a cutter 25, for example of the known guillotine type; and a station 26, for example of the type with a known automated manipulator, for offloading of the square pieces of the copper-aluminium-copper sandwich 29.

Figure 2:
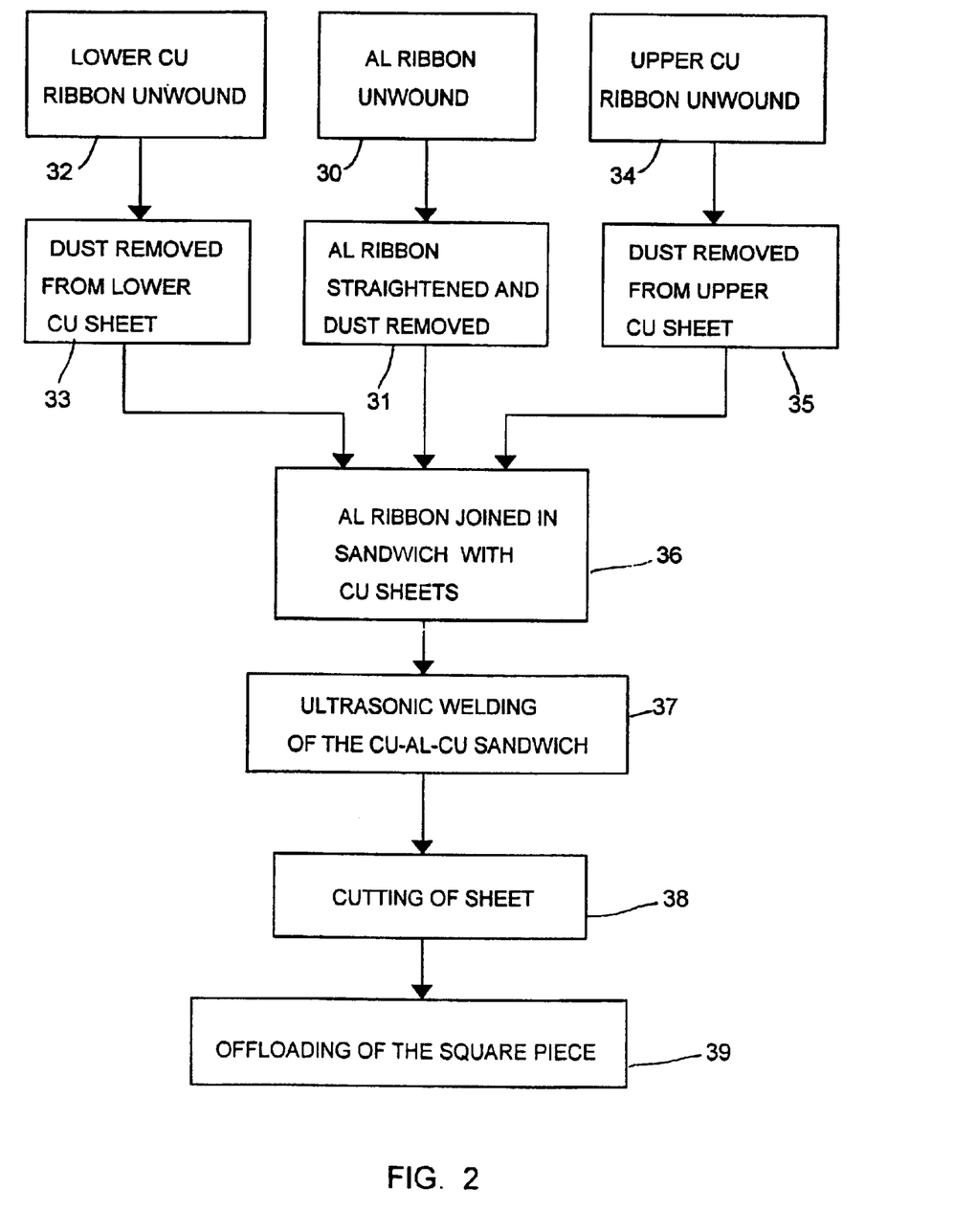
FIG. 2—Is a flow diagram of the operational sequence of the method for the manufacture of the component for multilayer printed circuit boards in accordance with this invention, in a first embodiment thereof.

Operation of the equipment listed above will now be described, with reference to FIG. 1 and to the flow diagram represented in FIG. 2.

The continuous aluminium ribbon 10 with a thickness of several tenths of a millimeter, generally 0.2–0.8 mm, preferably 0.3–0.5 mm, and a width generally between 350 and 700 mm, is unwound (step 30) by the unwinder 12, centred and fed by means of a transport system not shown in the figure, into the straightening device 13 and subsequently into the dust remover 14 in order to be straightened and dusted (step 31) on both faces; the continuous aluminium ribbon 10 is then fed, by means of a transport system not shown in the figures, into the joining station 15.

In parallel, the upper unwinder 27 unwinds the upper copper ribbon 18 from the upper reel 16 (step 32) and the lower unwinder 28 unwinds the lower copper ribbon 19 from the lower reel 17 (step 34); the lower face of the upper copper ribbon 18 and upper face of the lower copper ribbon 19 are dusted gradually as they are unwound, respectively by the first pair 21 of dust-removing rollers and by the second pair 22 of dust-removing rollers (steps 33 and 35). The dust-removing rollers 21 and 22 consist generally of rollers with an adhesive surface, which are suitable for rotating in an idle way in contact with the respective copper ribbon. The upper 18 and lower 19 copper ribbons are essentially the same width as the aluminium ribbon 10 and are generally of a thickness between 8 and 70 $\mu$m, preferably between 15 and 20 $\mu$m, though the thickness is not limited to these values, and may even be 0.4 mm.

The first pair of rubber-coated rollers 23, applying a pressure generally of between 1 and 4 bar, laminates the upper copper ribbon 18 with its lower face in contact with the upper face of the aluminium ribbon 10, and the lower copper ribbon 19 with its upper face in contact with the lower face of the aluminium ribbon 10, so as to create, in a temporary join, the copper-aluminium-copper sandwich 29 (step 36).

The first pair of rubber-coated rollers 23 also has the function of feeding the sandwich 29 towards the sonotrode 20, assisted in this by the second pair of rubber-coated rollers 24 whose function is to pull.

The sonotrode 20, as is already known to those acquainted with the sector art, consists of two pairs of steel wheels, not shown in the figures, with a diameter of 40 mm for example, with a slightly knurled profile, which produce a seam weld with a typical width of between 2 and 3 mm along the edge of the sandwich 29, by means of the combined action of pressure and of the heat generated by the emission of ultrasonic frequencies of $\geq$20 kHz, which make permanent the join between the three ribbons, whereby the ultrasonic welding makes two joining zones between the central ribbon of aluminium 10 and the outer ribbons of copper, upper 18 and lower 19.

The pressure is typically between 1 and 6 bar, preferably equal to approximately 3 bar, the power absorbed by the sonotrode is regulated in relation to the thickness of the copper ribbons to be welded and is typically between 0.5 and 2 kW, for a maximum weld speed of approximately 10 m/min. The distance between the two pairs of wheels in the direction of the width of the aluminium ribbon 10 can be regulated, and is done so simultaneously for both pairs in relation to the middle line of the ribbon 10 itself.

Down from the second pair of rubber-coated rollers 24, the sandwich 29 is passed through the cutter 25 which crops the sandwich 29 itself, sub-dividing it into square pieces of the desired dimensions (step 38); the square pieces are then conveyed to the offloading station 26 to be stacked and then taken away, either automatically or manually (step 39).

The method of the invention uses only well-known equipment, which is easy to find and capable of performing work of quality to a high level of reliability. In addition the ultrasonic welding does not require expendable materials, which are often very costly, as in the case of special adhesives, and which, being extraneous to the printed circuit board itself might produce waste or lead to re-working in the subsequent steps of the manufacturing process. In addition, the speed of the process is very high and makes it possible to join materials of variable thickness within ample limits without causing any problems.

DESCRIPTION OF A SECOND EMBODIMENT OF THE INVENTION

A second embodiment of the method for manufacture of the component for multilayer printed circuit boards in accordance with the invention will now be described, together with the relevant equipment used, with reference to FIG. 3, in which the same devices as described in the first embodiment retain the same reference numeral.

The first joining station 15 in FIG. 1 has been substituted by a second joining station 55, in which, in place of the sonotrode 20, the join between the upper 18 and lower 19 copper ribbons and the aluminium ribbon 10 is effected by means of two pairs of geared wheels 60 (knurls) with a sloping profile (in FIG. 3 only one pair is visible), made from case-hardened steel and with the distance between centres placed in such a way that the tip of the tooth on one wheel is not in contact with the corresponding space between the teeth of the other wheel.

Figure 3:
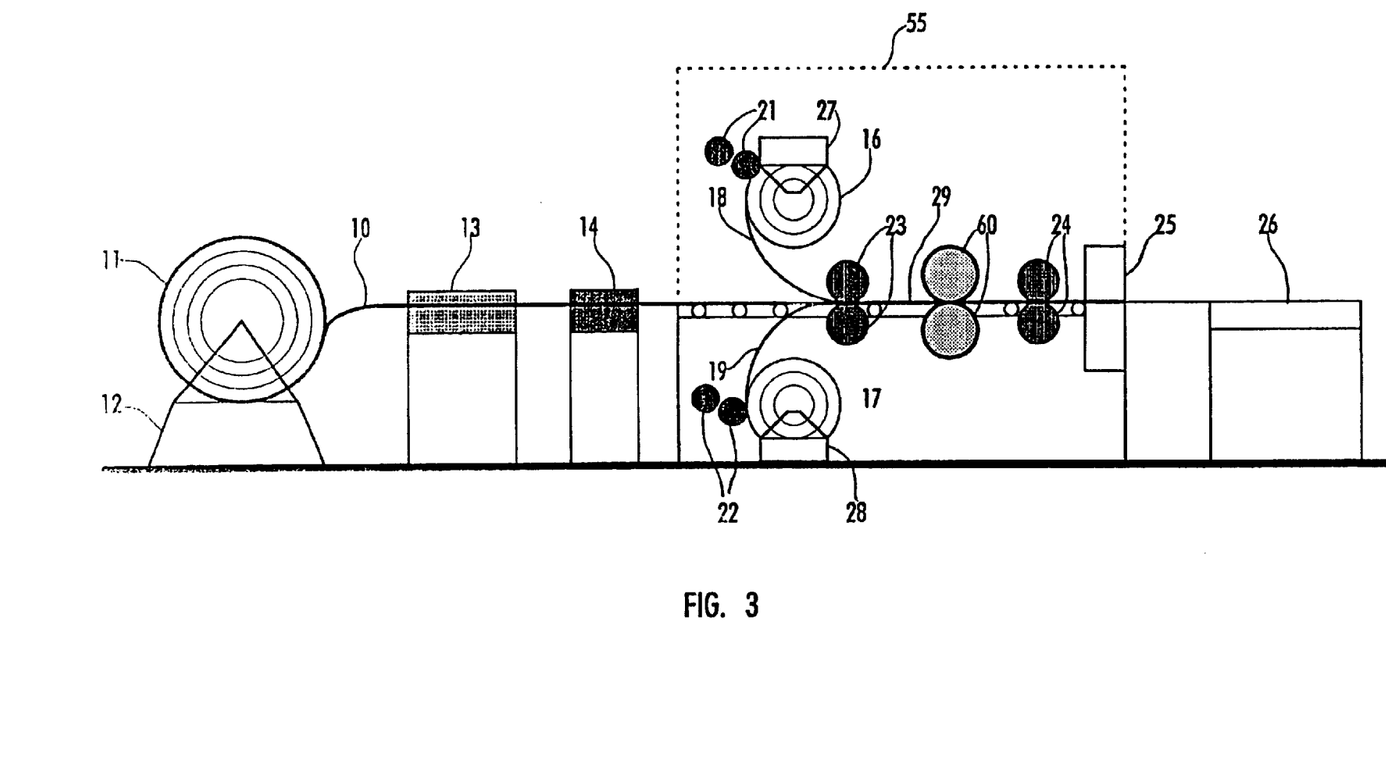
FIG. 3—Is a schematic view of the equipment used for the manufacture of the component for multilayer printed circuit boards in accordance with this invention, in a second embodiment thereof.
Figure 4:
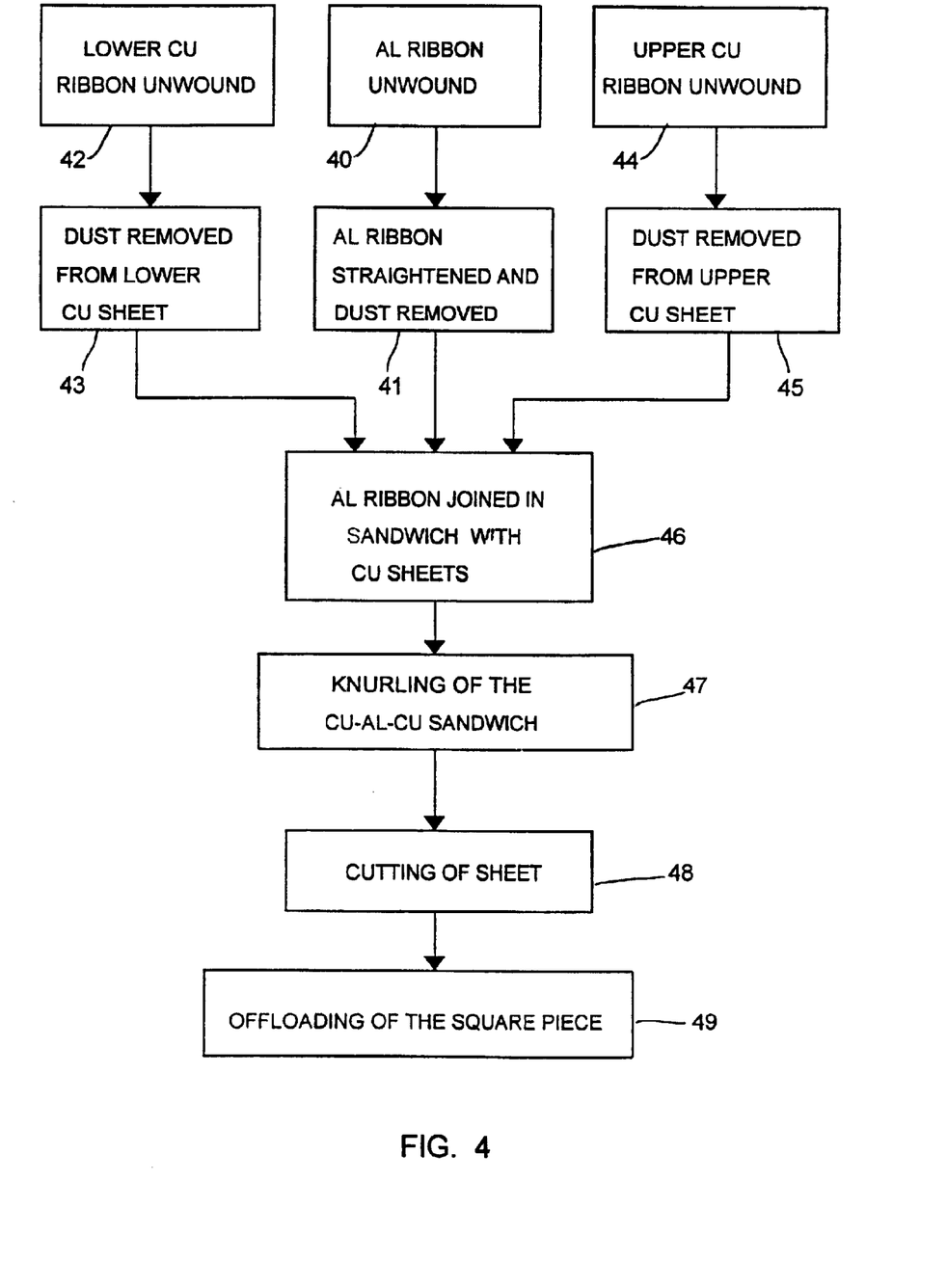
FIG. 4—Is a flow diagram of the operational sequence of the method for the manufacture of the component for multilayer printed circuit boards in accordance with this invention, in a second embodiment thereof.

Operation of the equipment in accordance with this second embodiment is now described, with reference to FIG. 3 and to the flow diagram represented in FIG. 4. In the latter, steps 40–46 and 48–49 are identical to the corresponding steps 30–36 and 38–39 of the flow diagram in FIG. 2, previously illustrated. Accordingly, only step 47 will be described in detail now, i.e. that of knurling of the copper-aluminium-copper sandwich 29.

As those acquainted with the sector art well know, the pair of geared wheels 60 leaves an imprint (knurl) on the sandwich 29 generally of a width of approximately 5 mm, which serves to mechanically join the three ribbons which make up the sandwich 29, by exploiting the plasticity of the materials. The pressure on the geared wheels 60 is typically between 3 and 5 bar, depending on the distance between the centres of the gears 60 themselves, a distance which must be substantially regulated only according to the thickness of the aluminium ribbon 10, with the two upper 18 and lower 19 copper ribbons completing the sandwich 29 typically limited to a thickness of 17–35 μm. The speed of the knurling joining process is typically 3 m/min. The advantage of this type of join is that the life of the geared wheels 60 is practically unlimited and in addition they cost less than the sonotrodes; on the other hand, the quality of the join may be negatively affected if the aluminium ribbon 10 has not been degreased perfectly.

Naturally changes may be made to the invention described above, without departing from the scope of the invention itself.

For example, it is possible, with reference to both of the embodiments described above, to envisage a joining process for the C-A-C sandwich 29 starting, not from the continuous aluminium ribbon 10, but from aluminium panels, loaded, for example, by means of a suction pad loader and a subsequent, known type centring device, at predetermined regular intervals in the first joining station 15 or, respectively in the second joining station 55, so the cutter 25 will only have to cut the copper ribbons.

Or else it is possible, with reference to both of the embodiments described above, to envisage a further work station between either the first 15 or second 55 joining station and the offloading station 26 of the square pieces, comprising a turning device to rotate by 90° a square which has previously been welded or knurled on two sides, and a further welding station, either ultrasonic or knurling, to complete the welding on all four sides.

DESCRIPTION OF A THIRD EMBODIMENT OF THE INVENTION

A third embodiment of the component in accordance with the invention will now be described, together with the relevant method for manufacture. For brevity's sake this third embodiment, since having characteristics and aspects mostly similar to those of the previous embodiments already described so as to be easily referable to the relative accompanying drawings, will be illustrated in the following without using specific drawings.

In particular, the component in accordance with the third embodiment comprises, similarly to what has already been described with reference to the previous embodiments, two copper sheets and one sheet or internal support of aluminium arranged between the two copper sheets, wherein these three sheets are welded together by means of an ultrasonic joining or joined mechanically, for example by knurling, so that, due to the presence of the internal aluminium sheet, the component is particularly malleable and not subject to being bent with ease.

In addition, the component also comprises a layer of resin deposited externally on one or both of the copper sheets, along their surface that are not facing the internal aluminium sheet.

In this way, each copper sheet, being covered by an external layer of resin, acquires a rigidity and ease of handling much greater than the copper sheet alone without a layer of resin, so that the component thus comprised is not subject to the main defect, namely the fragility, which instead afflicts the RCC type components currently available on the market.

Further, as there are no problems owing to fragility, it is possible to deposit layers of resin of even greater thickness than those of the traditional RCC type components.

Typically the thicknesses of the layer of resin deposited externally on this component range from 50 μm to 200 μm.

Deposition of the layer of resin is effected, after the aluminium sheet has been joined with the two copper sheets as described earlier with reference to the two previous embodiments, through various well-known depositing processes widely available on the market, such as silk-screen printing, film-coating, rollcoating, or dryfilm lamination.

The resin depositing process can be implemented in continuous mode in a stage prior to the final cutting of the component, or can be implemented on the cut pieces of the component, after it has been cut.

The component can also be made of a single copper sheet and an aluminium sheet joined together, with a layer of resin deposited on the outside of the copper sheet.

Accordingly the resin can be spread on the two external surfaces in the case of a three-sheet Copper-Aluminium-Copper (CAC) component, or on a single external face in the case of a two-sheet Copper-Aluminium (CA) component.

In short, the component of this third embodiment may be designated R-C-A-C-R (Resin-Copper-Aluminium-Copper-Resin) in the case of two joins, or R-C-A (Resin-Copper-Aluminium) in the case of a single join.

In short, while fully maintaining the principle of this invention, the construction details and the embodiments may be abundantly varied with respect to what has been described and illustrated, without departing from the scope of the invention.

What is claimed is:

1. Component for use in a manufacturing process of a multilayer printed circuit board, comprising:

a laminate having a perimeter, said laminate consisting of two copper sheets which, at the end of said manufacturing process, form a conductive layer of said printed circuit board, and of one aluminium sheet which is eliminated in the course of said manufacturing process and thereby does not form a part of said printed circuit board, said one aluminium sheet being arranged between said two copper sheets for constituting a support element of the copper sheets, one surface of each of said copper sheets (18, 19) and both surfaces of said aluminium sheet (10) being non-contaminated and super-imposed upon each other, wherein said one aluminium sheet (10) and said two copper sheets (18, 19) are bonded to each other by means of a single ultrasonic weld, of fixed width, along at least a part of said perimeter, whereby said single ultrasonic weld provides two joining zones between said two copper sheets and said one aluminium sheet in order to delimit two non-contaminated zones within said perimeter, on opposite sides of said aluminum sheet (10), wherein said component further comprises at least one layer of resin deposited at the outside on one of the surfaces, of said copper sheets, which are not super-imposed on said aluminum sheet, and wherein said fixed width of said ultrasonic weld is between 2 and 3 mm, said copper sheets have a thickness which is between 8 and 70 $\mu$m, said aluminum sheet has a thickness which is between 0.2 and 0.8 mm, and said layer of resin has a thickness which is between 50 $\mu$m and 200 $\mu$m.

2. Component according to claim 1, wherein said ultrasonic weld of fixed width is carried out along all of said perimeter.

3. Method for the manufacture of a multilayer printed circuit board, comprising the following steps:

disposing of two copper sheets which are provided for forming, at the end of the manufacturing process, a conductive layer of said printed circuit board, said copper sheets having each a thickness between 8 and 70 $\mu$m, disposing of one aluminium sheet which constitutes a support element for said two copper sheets and which is provided for being eliminated, in the course of said manufacturing process, so as not to form a part of said printed circuit board, said aluminium sheet having a thickness between 0.2 and 0.8 mm, one surface of each of said copper sheets and both surfaces of said aluminium sheet being provided for being super-imposed upon each other, feeding said two copper sheets and said one aluminium sheet in the form of continuous sheets from respective reels, straightening said one aluminium sheet, removing dust from said one surface of each of said copper sheets and from said both surfaces of said aluminium sheet which are provided for being super-imposed upon each other, super-imposing said two copper sheets and said one aluminium sheet, so as to form a continuous and advancing laminate or sandwich (29) in which said one aluminium sheet is arranged between said two copper sheets, applying a pressure on said advancing laminate, so as to temporary join the three sheets of said laminate, and bonding to each other of said one aluminium sheet and of said two copper sheets by means of an ultrasonic welding operation, of fixed width, along the external edges of said advancing laminate, so as to permanently join said three sheets and to delimit two non-contaminated zones on opposite sides of said aluminium sheet, wherein said fixed width of said ultrasonic welding operation is between 2 and 3 mm.

4. Method for the manufacture of a multilayer printed circuit board according to claim 3, further comprising after said ultrasonic welding operation:

a cutting step to reduce the welded laminate into cut pieces, and depositing at least one layer of resin on one of the external surfaces of said two copper sheets, which are not super-imposed on said aluminium sheet, wherein said layer of resin has a thickness between 50 $\mu$m and 200 $\mu$m;

wherein the deposition of the layer of resin is effected as a continuous process on said laminate, prior to said cutting step, through a technology selected from a group comprising: silk-screen printing, rollercoating, and dryfilm lamination.

5. Method for the manufacture of a multilayer printed circuit board according to claim 3, further comprising after said ultrasonic welding operation:

a cutting step to reduce the welded laminate into cut pieces, and depositing at least one layer of resin on one of the external surfaces of said two copper sheets, which are not super-imposed on said aluminium sheet, wherein said layer of resin has a thickness between 50 $\mu$m and 200 $\mu$m, wherein the deposition of the layer of resin is effected on the cut pieces of said laminate through a technology selected from a group comprising: silk-screen printing, rollercoating, and dryfilm lamination.

6. Method for the manufacture of a multilayer printed circuit board according to claim 3, also comprising after said ultrasonic welding operation:

a cutting step to reduce the welded laminate into cut pieces, a further ultrasonic welding operation for completing the welding on all the-sides of said cut pieces, and depositing, after said further ultrasonic operation, at least one layer of resin on one of the external surfaces of said two copper sheets, which are not super-imposed on said aluminium sheet, wherein said layer of resin has a thickness between 50 $\mu$m and 200 $\mu$m.

7. Method for the manufacture of a multilayer printed circuit board according to claim 3, in which the step of removing dust from said one surface of each of said copper sheets and from said both surfaces of said aluminum sheet provided for being super-imposed upon each other is performed by means of rollers having an adhesive surface.

8. Method for the manufacture of a multilayer printed circuit board according to claim 3, wherein said ultrasonic welding operation is carried out at a speed of not more than 10 m/min.

9. Method for the manufacture of a multilayer printed circuit board according to claim 3, wherein said ultrasonic welding operation is executed at a frequency equal to or greater than 20 KHz.

10. Method for the manufacture of a multilayer printed circuit board according to claim 3, wherein the step of applying a pressure on said advancing laminate is performed by means of a pair of rectified, rubber-coated rollers.

11. Method for the manufacture of a multilayer printed circuit board, comprising the following steps:

disposing of two copper sheets which are provided for forming, at the end of the manufacturing process, a conductive layer of said printed circuit board, said copper sheets having each a thickness between 8 and 70 $\mu$m, disposing of one aluminium sheet which constitutes a support element for said two copper sheets and which is provided for being eliminated, in the course of said manufacturing process, so as not to form a part of said printed circuit board, said aluminium sheet having a thickness between 0.2 and 0.8 mm, one surface of each of said copper sheets and both surfaces of said aluminium sheet being provided for being super-imposed upon each other, feeding said two copper sheets and said one aluminium sheet in the form of continuous sheets from respective reels, straightening said one aluminium sheet, removing dust from said one surface of each of said copper sheets and from said both surfaces of said aluminium sheet which are provided for being super-imposed upon each other, super-imposing said two copper sheets and said one aluminium sheet, so as to form a continuous and advancing laminate or sandwich (29) in which said one aluminium sheet is arranged between said two copper sheets, applying a pressure on said advancing laminate, so as to temporary join the three sheets of said laminate, bonding to each other of said one aluminium sheet and of said two copper sheets by means of an ultrasonic welding operation, of fixed width, along the external edges of said advancing laminate, so as to permanently join said three sheets and to delimit two non-contaminated zones on opposite sides of said aluminium sheet, wherein said ultrasonic welding operation includes the use of a pressure between 1 and 6 bar; and depositing, after the bonding step, at least one layer of resin on one of the external surfaces of said two copper sheets, which are not super-imposed on said aluminium sheet, wherein said layer of resin has a thickness between 50 $\mu$m and 200 $\mu$m.

12. Method for the manufacture of a multilayer printed circuit board, comprising the following steps:

disposing of two copper sheets which are provided for forming, at the end of the manufacturing process, a conductive layer of said printed circuit board, said copper sheets having each a thickness between 8 and 70 $\mu$m, disposing of one aluminium sheet which constitutes a support element for said two copper sheets and which is provided for being eliminated, in the course of said manufacturing process, so as not to form a part of said printed circuit board, said aluminium sheet having a thickness between 0.2 and 0.8 mm, one surface of each of said copper sheets and both surfaces of said aluminium sheet being provided for being super-imposed upon each other, feeding said two copper sheets and said one aluminium sheet in the form of continuous sheets from respective reels, straightening said one aluminium sheet, removing dust from said one surface of each of said copper sheets and from said both surfaces of said aluminium sheet which are provided for being super-imposed upon each other, super-imposing said two copper sheets and said one aluminium sheet, so as to form a continuous and advancing laminate or sandwich (29) in which said one aluminium sheet is arranged between said two copper sheets, applying a pressure on said advancing laminate, so as to temporary join the three sheets of said laminate, bonding to each other of said one aluminum sheet and of said two copper sheets by means of an ultrasonic welding operation, of fixed width, along the external edges of said advancing laminate, so as to permanently join said three sheets and to delimit two non-contaminated zones on opposite sides of said aluminum sheet, wherein said ultrasonic welding operation includes the use of a power between 0.5 and 2 kW; and depositing, after the bonding step, at least one layer of resin on one of the external surfaces of said two copper sheets, which are not super-imposed on said aluminium sheet, wherein said layer of resin has a thickness between 50 $\mu$m and 200 $\mu$m.

13. Component provided for use in a manufacturing process of a multilayer printed circuit board, comprising:

a laminate having a perimeter, said laminate consisting in a first embodiment, of one copper sheet or, in a second embodiment, of two copper sheets which is/are provided for forming, at the end of said manufacturing process, a conductive layer of said printed circuit board, and of one aluminium sheet which constitutes a support element for said one copper sheet or for said two copper sheets, respectively in said first or in said second embodiment, and is provided for being eliminated in the course of said manufacturing process, said one aluminium sheet being arranged in the second embodiment between said two copper sheets, one surface of said one copper sheet and one surface of said one aluminium sheet being super-imposed upon each other, in the first embodiment, and one surface of each of said two copper sheets and two opposite surfaces of said one aluminium sheet being super-imposed upon each other, in the second embodiment, wherein said one aluminum sheet and said one copper sheet, in the first embodiment, or said one aluminum sheet and said two copper sheets, in the second embodiment, are bonded to each other along at least a part of said perimeter by means of an ultrasonic weld, of fixed width, in order to delimit a non-contaminated zone within said perimeter, on one side or respectively on two opposite sides of said one aluminum sheet, said fixed width being between 2 and 3 mm, and wherein said component further comprises a layer of resin deposited externally on the face of said one copper sheet or on the faces of said two copper sheets, which is/are not super-imposed on said one aluminum sheet, respectively in said first or in said second embodiment said layer of resin having a thickness between 50 μm and 200 μm.

14. Method for the manufacture of a multilayer printed circuit board, comprising the following steps:

disposing, in a first embodiment, of one copper sheet or, in a second embodiment, of two copper sheets which is/are provided for forming, at the end of the manufacturing process, a conductive layer of said printed circuit board, disposing of one aluminium sheet which constitutes a support element for said one copper sheet or for said two copper sheets, respectively in said first or in said second embodiment, and which is provided for being eliminated in the course of said manufacturing process, one surface of said one copper sheet and one surface of said one aluminium sheet, in said first embodiment, or one surface of each of said two copper sheets and two opposite surfaces of said one aluminium sheet, in said second embodiment, being provided for being super-imposed upon each other;

feeding said one copper sheet or said two copper sheets, respectively in said first or in said second embodiment, and said one aluminium sheet in the form of continuous sheets from respective reels, straightening said one aluminium sheet, removing dust from said one surface of said one copper sheet and from said one surface of said one aluminium sheet, or from said one surface of each of said two copper sheets and from said two opposite surfaces of said one aluminium sheet, which are provided for being super-imposed upon each other, super-imposing said one copper sheet and said one aluminium sheet, in said first embodiment, or said two copper sheets and said one aluminium sheet, in said second embodiment, so as to form an advancing laminate or sandwich, in the second embodiment said one aluminium sheet being arranged between said two copper sheets, applying a pressure on said advancing laminate, so as to temporary join the two or the three sheets of said laminate, bonding to each other of said one aluminum sheet and said one copper sheet, in said first embodiment, or each other of said one aluminum sheet and of said two copper sheets, in said second embodiment, by means of an ultrasonic welding, of fixed width, along the edges of said advancing laminate, in order to delimit a non-contaminated zone within the edges of said laminate, on one side or on two opposite sides of said one aluminum sheet, said fixed width being between 2 and 3 mm; and depositing a layer of resin on the external face, of said one copper sheet or on the two external faces of said two copper sheets, which is/are not super-imposed on said one aluminum sheet, respectively in said first or in said second embodiment, wherein said layer of resin has a thickness between 50 μm and 200 μm.

15. Method for the manufacture of a multilayer printed circuit board according to claim 13, further comprising a cutting step to reduce said laminate into cut pieces, wherein the deposition of the layer of resin is effected as a continuous process on said laminate and prior to said cutting step through a technology selected from a group comprising: silk-screen printing, rollerocating, and dryfilm lamination.

16. Method for the manufacture of a multilayer printed circuit board according to claim 14, further comprising a cutting step to reduce said laminate into cut pieces, wherein the deposition of the layer of resin is effected on the cut pieces of said laminate through a technology selected from a group comprising: silk-screen printing, rollerocating, and dryfilm lamination.

17. Component for use in a manufacturing process of a multilayer printed circuit board, comprising:

a laminate having a perimeter, said laminate consisting of two copper sheets which, at the end of said manufacturing process, form a conductive layer of said printed circuit board, and of one aluminium sheet which is eliminated in the course of said manufacturing process and thereby does not form a part of said printed circuit board, said one aluminium sheet being arranged between said two copper sheets of constituting a support element of the copper sheets, one surface of each of said copper sheets (18, 19) and both surfaces of said aluminium sheet (10) being non-contaminated and super-imposed upon each other, wherein said one aluminum sheet (10) and said two copper sheets (18, 19) are bonded to each other by means of a single ultrasonic weld, of fixed width, along at least a part of said perimeter, whereby said single ultrasonic weld provides two joining zones between said two copper sheets and said one aluminum sheet in order to delimit two non-contaminated zones within said perimeter, on opposite sides of said aluminum sheet (10), and wherein said fixed width of said ultrasonic weld is between 2 and 3 mm.

* * * * *

UNITED STATES PATENT AND TRADEMARK OFFICE
CERTIFICATE OF CORRECTION

PATENT NO. : 6,709,769 B1
DATED : March 23, 2004
INVENTOR(S) : Giuseppe Pedretti

It is certified that error appears in the above-identified patent and that said Letters Patent is hereby corrected as shown below:

Title page,
Item [30], Foreign Application Priority Data, please replace "TO98A0779" with -- TO98A000779 --

Column 12,
Line 11, please replace "claim 13" with -- claim 14 --.

Signed and Sealed this

Fourth Day of January, 2005

JON W. DUDAS
*Director of the United States Patent and Trademark Office*